United States Patent
Huang et al.

(10) Patent No.: US 7,468,760 B2
(45) Date of Patent: Dec. 23, 2008

(54) APPARATUS AND RELATED METHOD FOR LEVEL CLAMPING CONTROL

(75) Inventors: Ke-Chiang Huang, Hsinchu (TW); Ta-Chan Kao, Taipei (TW); Sterling Smith, Hsin-Chu Hsien (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 602 days.

(21) Appl. No.: 11/163,153

(22) Filed: Oct. 6, 2005

(65) Prior Publication Data

US 2006/0220936 A1    Oct. 5, 2006

Related U.S. Application Data

(60) Provisional application No. 60/594,366, filed on Mar. 31, 2005.

(51) Int. Cl.
*H04N 5/18* (2006.01)
*H03M 1/06* (2006.01)

(52) U.S. Cl. .................. 348/695; 348/677; 348/689; 341/144; 341/118

(58) Field of Classification Search ............ 348/572, 348/677, 689, 695; 341/144, 154, 118
See application file for complete search history.

(56) References Cited

U.S. PATENT DOCUMENTS

| | | | |
|---|---|---|---|
| 5,161,170 A | | 11/1992 | Gilbert |
| 5,231,360 A | | 7/1993 | Storey |
| 5,280,356 A | * | 1/1994 | Hiramatsu et al. .......... 348/691 |
| 5,341,218 A | * | 8/1994 | Kaneko et al. .............. 348/695 |
| 5,379,075 A | * | 1/1995 | Nagasawa et al. ........... 348/678 |
| 5,461,489 A | * | 10/1995 | Ohara et al. ................ 358/409 |
| 5,532,749 A | | 7/1996 | Hong |
| 5,640,670 A | | 6/1997 | Samueli |
| 5,696,559 A | * | 12/1997 | Kim ........................... 348/691 |
| 5,767,751 A | | 6/1998 | Magnusson |
| 5,784,118 A | | 7/1998 | Yamauchi |
| 5,798,802 A | * | 8/1998 | Elmis et al. ................. 348/689 |
| 5,841,488 A | * | 11/1998 | Rumreich .................... 348/694 |
| 5,990,968 A | | 11/1999 | Naka |
| 6,141,057 A | | 10/2000 | Cooper |
| 6,211,918 B1 | | 4/2001 | Uwabata |
| 6,340,993 B1 | | 1/2002 | Hasegawa |

(Continued)

FOREIGN PATENT DOCUMENTS

GB    2 332 313 A    6/1999

(Continued)

*Primary Examiner*—Brian P Yenke
(74) *Attorney, Agent, or Firm*—Winston Hsu

(57) ABSTRACT

A level clamping control circuit and associated level clamping control method are provided. The level clamping control circuit includes a reference level estimator, a subtractor, a clamping computation circuit, a dithering circuit, and a digital-to-analog converter (DAC). The reference level estimator estimates a reference level of the input signal. The subtractor computes a difference between the reference level and a desired reference level to output a difference signal. The clamping computation circuit generates a first control value according to the difference signal. The dithering circuit dithers the first control value to alternately output a plurality of second control values. Finally, the DAC respectively utilizes the second control values to charge or discharge a capacitor to adjust the reference level of the input signal.

17 Claims, 3 Drawing Sheets

U.S. PATENT DOCUMENTS

| | | |
|---|---|---|
| 6,522,365 B1 | 2/2003 | Levantovsky |
| 6,522,369 B2 | 2/2003 | Ohta |
| 6,580,382 B2 | 6/2003 | Yung |
| 6,587,144 B1 * | 7/2003 | Kim .................... 348/241 |
| 6,621,523 B2 | 9/2003 | Obitsu |
| 6,650,364 B1 | 11/2003 | Itani |
| 6,707,503 B1 | 3/2004 | Naka |
| 6,724,430 B2 | 4/2004 | Miyoshi |
| 6,768,498 B1 | 7/2004 | Kim |
| 7,061,541 B2 | 6/2006 | Kim |
| 7,095,452 B2 * | 8/2006 | Tachibana ............... 348/691 |
| 7,098,824 B2 * | 8/2006 | Yang et al. .............. 341/131 |
| 7,106,231 B2 * | 9/2006 | Smith et al. ............ 341/120 |
| 7,106,387 B2 * | 9/2006 | Takimoto ............... 348/695 |
| 7,126,645 B2 * | 10/2006 | Keen .................... 348/695 |
| 7,253,755 B1 | 8/2007 | Fette |
| 7,268,714 B2 | 9/2007 | Sherry |
| 7,355,653 B2 | 4/2008 | Nagamine |
| 2003/0207675 A1 | 11/2003 | Hughes |
| 2005/0001750 A1 * | 1/2005 | Lo et al. ................ 341/143 |
| 2005/0270212 A1 * | 12/2005 | Smith et al. ............ 341/155 |

FOREIGN PATENT DOCUMENTS

| | | |
|---|---|---|
| JP | 2-301209 | 12/1990 |
| WO | 2004082136 A1 | 9/2004 |

* cited by examiner

APPARATUS AND RELATED METHOD FOR LEVEL CLAMPING CONTROL

CROSS REFERENCE TO RELATED APPLICATIONS

This application claims the benefit of U.S. Provisional Application No. 60/594,366, which was filed on 31 Mar. 2005 and is included herein by reference.

BACKGROUND OF THE INVENTION

1. Field of the Invention

The invention relates to an apparatus and method for level clamping a composite video signal, and more particularly, to an apparatus and related method for level clamping the composite video signal utilizing a dithering circuit.

2. Description of the Prior Art

Since the introduction of the Advanced Television Systems Committee (ATSC) standard, great effort has been expended to perfect a digital TV system. For compatibility, a digital TV system designed for decoding a digital TV signal that is in compliance with an ATSC specification must also be capable of decoding a composite video signal that is in compliance with specifications of traditional analog TV systems, such as the National Television System Committee (NTSC) standard or the Phase Alternate Line (PAL) standard. In this way, a user is able to watch programs using the same equipment regardless of the signal being transmitted by a digital TV signal or an analog TV signal.

Before any signal processing is performed on the composite video signal, a blank level of the composite video signal must be clamped in advance. Since the amplitude and the phase of the composite video signal are crucial to decoding the composite video signal, how accurately the blank level is clamped can seriously affect the performance of a video decoder for decoding the composite video signal. Conventionally, if one needs to clamp the blank level of the composite video signal more accurately, the clamping precision of a level clamping circuit must be improved so that an output signal of the level clamping circuit for clamping the blank level of the composite video signal is finer. The level clamping circuit is generally integrated into the video decoder and is implemented in the digital domain for clamping the desired blank level. In other words, for the blank level of the composite video signal to be more accurate, a step size of the output of the level clamping circuit must be smaller, which increases the cost and the size of the level clamping circuit.

SUMMARY OF THE INVENTION

It is therefore one of the objectives of the claimed invention to provide an apparatus and related method for level clamping a composite video signal utilizing a dithering circuit, to solve the above-mentioned problems.

The claimed invention provides a level clamping control circuit for an input signal passing through a capacitor. The level clamping control circuit contains: a reference level estimator, a subtractor, a clamping computation circuit, a dithering circuit, and a current-output digital-to-analog converter (DAC). The reference level estimator estimates a reference level of the input signal. The subtractor computes a difference between the reference level and a desired reference level to output a difference signal. The clamping computation circuit generates a first control value according to the difference signal. The dithering circuit dithers the first control value to alternately output a plurality of second control values. Finally, the current-output DAC respectively utilizes the second control values to determine an analog signal to charge or discharge the capacitor to adjust the reference level of the input signal. Typically, the above capacitor is an AC-coupling capacitor.

The claimed invention further provides a level clamping method. The method comprising: estimating a reference level of the input signal; computing a difference between the reference level and a desired reference level to output a difference signal; generating a first control value according to the difference signal; dithering the first control value to alternately output a plurality of second control values; and respectively utilizing the second control values to determine an analog signal to charge or discharge a capacitor to adjust the reference level of the input signal.

In addition, the claimed invention further provides a video decoder for decoding a composite video signal to output a luminance signal and a chrominance signal. The video decoder comprises an analog-to-digital converter (ADC), a reference level estimator, a subtractor, a clamping computation circuit, a dithering circuit, a digital-to-analog converter (DAC), a luminance/chrominance separator, an interpolation phase generator, and a digital interpolator. The ADC digitizes the composite video signal to generate an input signal according to a reference clock. The reference level estimator, coupled to the ADC, estimates a reference level of the input signal. The subtractor, coupled to the reference level estimator, computes a difference between the reference level and a desired reference level to output a difference signal. The clamping computation circuit, coupled to the subtractor, generates a first control value according to the difference signal. The dithering circuit, coupled to the clamping computation circuit, dithers the first control value to alternately output a plurality of second control values. The DAC, coupled to the dithering circuit and a capacitor, respectively utilizes the second control values to determine an analog signal to charge or discharge the capacitor to adjust the reference level of the composite video signal. The luminance/chrominance separator coupled to the ADC, generates a pre-luminance signal and a pre-chrominance signal according to the input signal. The interpolation phase generator, coupled to the ADC, generates an interpolation phase utilized to horizontally re-scale the pre-luminance signal and the pre-chrominance signal according to the horizontal synchronization tips of the composite video signal. Finally, the digital interpolator, coupled to the luminance/chrominance separator and the interpolation phase generator, re-scales the pre-luminance signal and the pre-chrominance signal to generate the luminance signal and the chrominance signal according to the interpolation phase.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
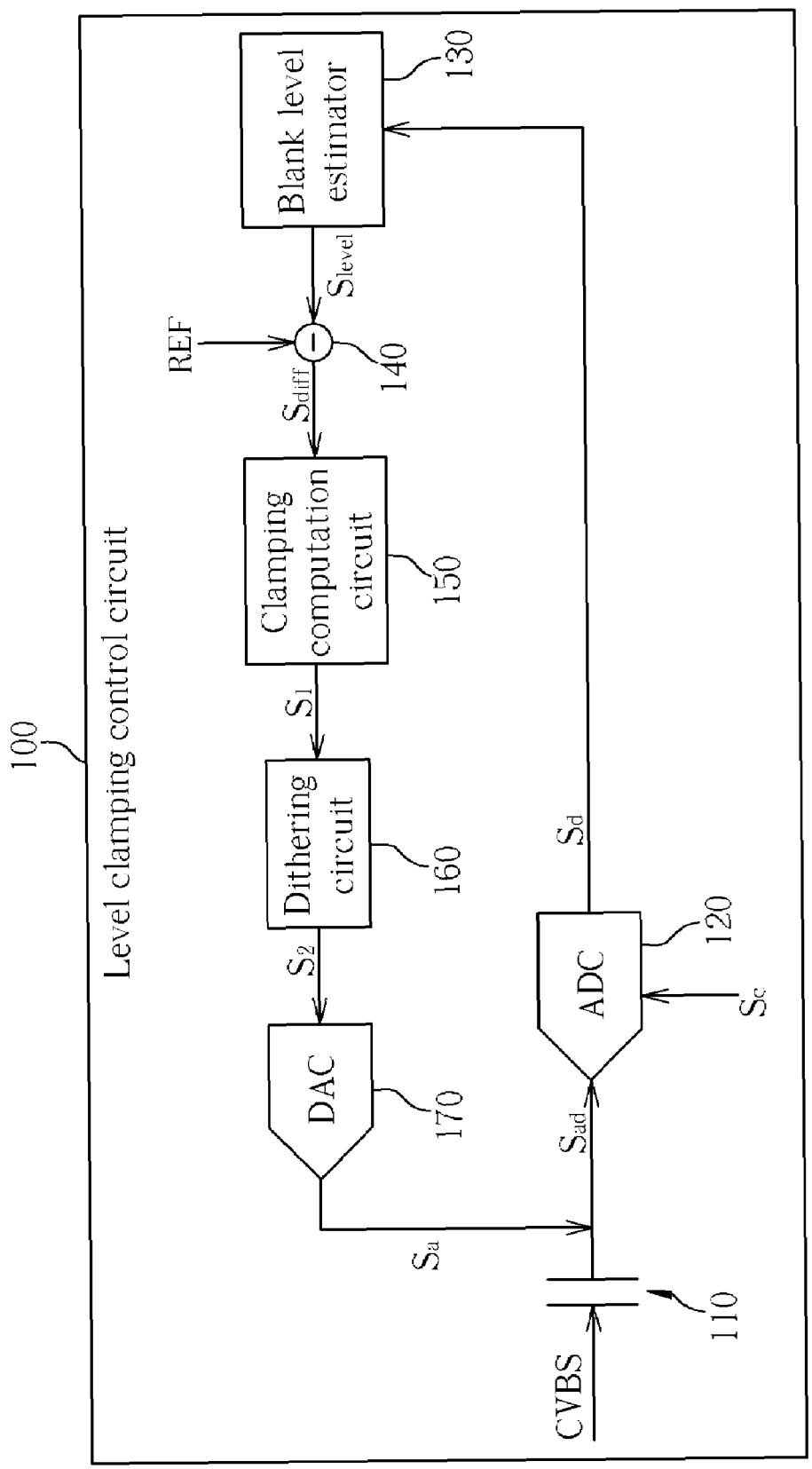
FIG. 1 is a block diagram illustrating a level clamping control circuit according to one embodiment of the present invention.

FIG. 1 shows a block diagram illustrating a level clamping control circuit 100 according to one embodiment of the present invention. The level clamping control circuit 100 comprises: a capacitor 110, an analog-to-digital converter (ADC) 120, a blank level estimator 130, a subtractor, 140, a clamping computation circuit 150, a dithering circuit 160, and a current-output digital-to-analog converter (DAC) 170. In this embodiment, an input signal of the level clamping control circuit 100, a composite video signal CVBS, is an analog TV signal. The composite video signal CVBS complies with an analog TV system specification, such as a National Television System Committee (NTSC) specification or a Phase Alternate Line (PAL) specification. The capacitor 110 is implemented for adjusting the DC level of the incoming composite video signal CVBS. The reference level is, for example, a blank level of the composite video signal CVBS. Please note that the input signal, the composite video signal CVBS, used in the present embodiment is only an example for illustrating the functionality of the level clamping control circuit 100 and is not meant to be taken as a limitation of the present invention. After adjusting the DC level of the composite video signal CVBS, the capacitor 110 outputs an adjusted composite video signal $S_{ad}$ which is then fed into the ADC 120. ADC 120 digitalizes the adjusted composite video signal $S_{ad}$ to generate a digital signal $S_d$ for further signal processing. A reference clock $S_c$ is inputted into the ADC 120 and the ADC 120 samples the adjusted composite video signal $S_{ad}$ utilizing the reference clock $S_c$.

After receiving the digital signal $S_d$, the blank level estimator 130 starts estimating a blank level of the digital signal $S_d$ and generates an estimated blank level signal $S_{level}$. The blank level of the digital signal $S_d$ is estimated in a specific window after an appearance of a horizontal synchronization tip (H-sync). Accordingly, the estimated blank level signal $S_{level}$ is preferably updated once for each scan line duration in this embodiment. The subtractor 140 generates a difference signal $S_{diff}$ by subtracting a desired reference signal REF from the estimated blank level signal $S_{level}$. Then, the following clamping computation circuit 150 generates a first control signal $S_1$ according to the difference signal $S_{diff}$. The first control signal $S_1$ determines the capacitor 110 to be charged or discharged, and the first control signal $S_1$ further determines how much the capacitor 110 should be charged or discharged.

In this embodiment, the DAC 170 of low-resolution is applied to further reduce the cost. Therefore, the DAC 170 is unable to convert the first control signal $S_1$ into an exact current level. For instance, the value transmitted by the first control signal $S_1$ may indicate a decimal fraction below the least significant bit (LSB) of the DAC 170. That is, a step size of the DAC 170 used in the present embodiment is too large, resulting in an inaccurate current level corresponding to the value transmitted by the first control signal $S_1$. Therefore, the dithering circuit 160 dithers the first control signal $S_1$ to output a second control signal $S_2$. Preferably, the second control signal $S_2$ transmits a plurality of integers. A mean value of the integers transmitted by the second control signal $S_2$ substantially equals a value transmitted by the first control $S_1$. For example, a value transmitted by the first control signal $S_1$ is 7.25. Since the step size of the DAC 170 is so large that the DAC 170 can only convert an integer precisely, the dithering circuit 160 preferably dithers the first control signal $S_1$ such that a plurality of values cyclically transmitted by the second control signal $S_2$ are 7, 7, 7 and 8. As a result, a mean value of the values is equal to the value transmitted by the first control signal $S_1$ and then the DAC 170 converts the integer values into an analog signal $S_a$ more precisely in an average sense. The dithering circuit 160 in this embodiment is implemented by a Sigma-Delta Modulator (SDM), but using the SDM is not a limitation of the present invention.

Please note that, in the present embodiment, the integers transmitted by the second control signal $S_2$ include 2 different integers. However, in another embodiment, the integers transmitted by the second control signal $S_2$ can include more than 2 different integers depending on the design requirements. The dithering circuit 160 overcomes the precision mismatch problem between the DAC 170 and the clamping computation circuit 150.

As the second control signal $S_2$ is inputted into the DAC 170, the DAC 170 respectively utilizes the values transmitted by the second control signal $S_2$ to determine the output current $S_a$ used to charge or discharge the capacitor 110 for tuning the blank level of the composite video signal CVBS. Preferably, before the blank level estimator estimates a new estimated blank level of the digital signal $S_d$, the dithering circuit 160 will keep dithering the value transmitted by the first control signal $S_1$. Therefore, the DAC 170 always keeps charging or discharging the capacitor 170 according to the second control signal $S_2$. Preferably, a capacitance of the capacitor 170 is very large, for example 10 µF. The DC voltage level of the capacitor 170 is slightly adjusted while the DAC 170 is charging or discharging the capacitor 170, regardless of the fact that the DAC 170 is charging or discharging the capacitor 170 continuously.

Figure 2:
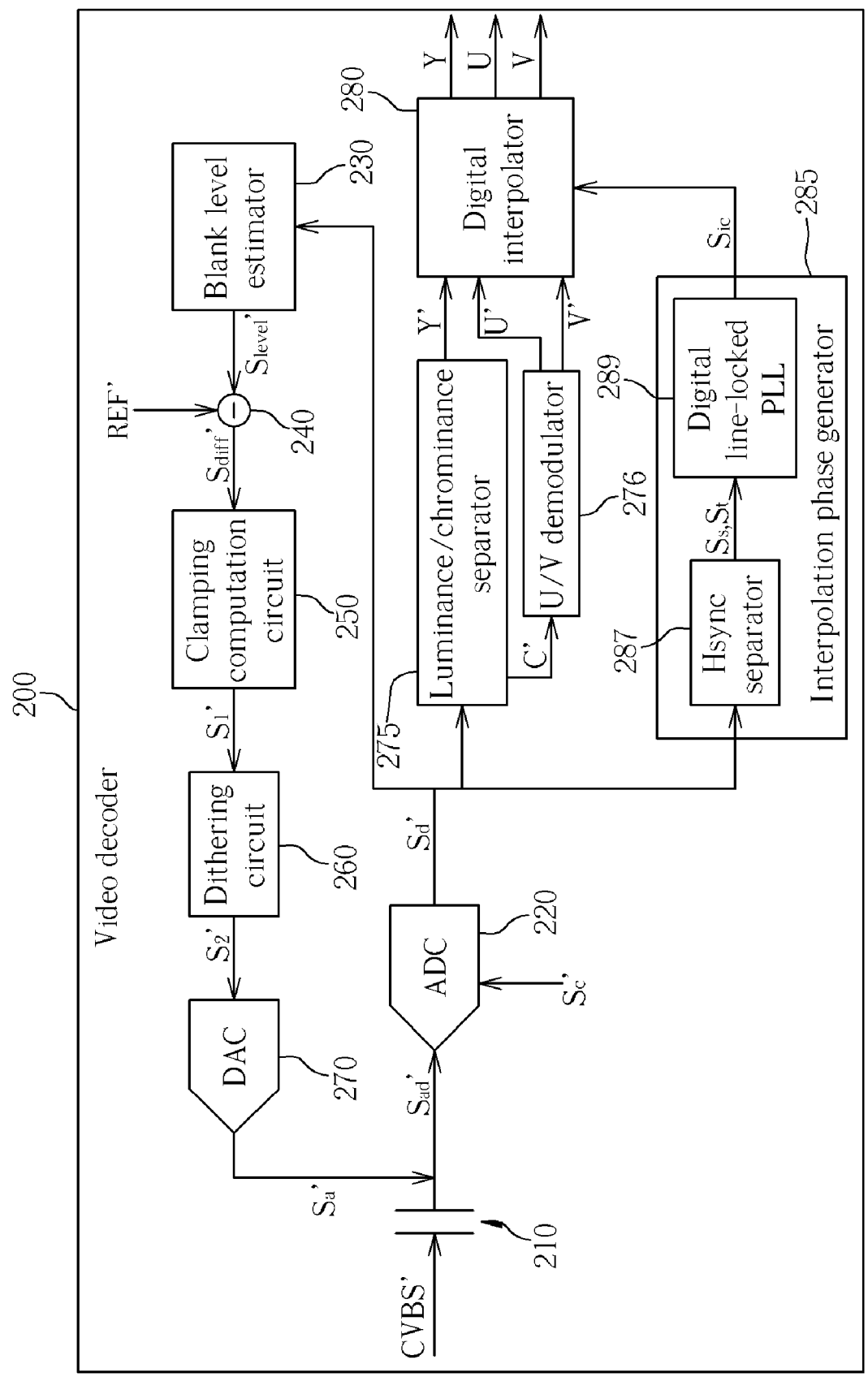
FIG. 2 is a block diagram illustrating a video decoder utilizing the above-mentioned level clamping control circuit according to another embodiment of the present invention.

Please refer to FIG. 2. FIG. 2 is a block diagram illustrating a video decoder 200 utilizing the above-mentioned level clamping control circuit 100 according to an embodiment of the present invention. The video decoder 200 receives a composite video signal CVBS' and decodes the composite video signal CVBS' to generate a luminance signal Y and a chrominance signal C. The above-mentioned operations to generate a digital signal $S_d$' as well as to clamp a blank level of an input signal, the composite video signal CVBS', are similar to that of the level clamping control circuit 100. In FIG. 1 and FIG. 2, the components of the same name, such as capacitors 110, 210, ADCs 120, 220, blank level estimators 130, 230, subtractors 140, 240, clamping computation circuits 150, 250, dithering circuits 160, 260, and DACs 170, 270, have the same operation and functionality. Similar description is omitted hereby for brevity.

The luminance/chrominance separator 275 receives the digital signal $S_d$' and generates a pre-luminance signal Y' and a pre-chrominance signal C' by analyzing the digital signal $S_d$'. The pre-chrominance signal C' is further fed into the following U/V demodulator 276. The U/V demodulator 276 demodulates the pre-chrominance signal C' and then generates a first pre-chrominance signal U' as well as a second pre-chrominance signal V'. To facilitate the demodulation of the pre-chrominance signal C', a reference clock $S_c$' is preferably synchronized to four times as great as a frequency of a sub-carrier of the chrominance signal C of the composite video signal CVBS'. Therefore, a data rate of the digital signal $S_d$' is also four times as great as the frequency of the sub-carrier of the pre-chrominance signal C' of the composite video signal CVBS'. But this data rate of the digital signal $S_d$' does not match that required to display a video program transmitted by the composite video signal CVBS' for each scan line on a TV screen. As a result, the digital interpolator 280 is utilized to re-scale the pre-luminance signal Y', the first pre-chrominance signal U' and the second pre-chrominance signal V' to generate the desired luminance signal Y, the first chrominance signal U and the second chrominance signal V according to an interpolation phase Sic. In this way, data rates of the luminance signal Y, the first chrominance signal U and the second chrominance signal V match that required for displaying pixels at each scan line.

In one embodiment, the synchronized clock $S_c$' is synchronized to a frequency that is a multiple of four times the frequency of a sub-carrier of the chrominance signal C of the composite video signal CVBS'. Therefore, an additional down-sampler (not shown) is required to down-sample the digital signal $S_d$' to generate a first digital signal with a data rate of four times as great as the frequency of the sub-carrier of the composite video signal CVBS'. Also, in this embodiment, a digital filter (not shown) can be added between the ADC 220 and the above-mentioned down-sampler to filter out a high frequency noise component of the digital signal $S_d'$ and then to generate a filtered signal to be inputted to the above-mentioned down-sampler. As the data rate of the digital signal $S_d'$ increases the obtainable digital filter performance increases as well. In this way, the high frequency noise component can be filtered out more thoroughly. Then the first digital signal is fed into the blank level estimator 230, the luminance/chrominance separator 275 and the interpolation phase generator 285 to continue processing.

As shown in FIG. 2, the interpolation phase generator 285 contains an Hsync separator 287 and a digital line-locked phase-locked loop (PLL) 289. The Hsync separator 287 receives the digital signal $S_d'$ and separates the horizontal synchronization tips to determine a starting boundary signal $S_s$ and a terminating boundary signal $S_t$ for each scan line for displaying a video program transmitted by the composite video signal CVBS', according to two successive horizontal synchronization tips. A synchronization tip is defined in a specification of an analog TV system for recognizing a starting point of a scan line. According to the starting boundary signal $S_s$ and the terminating boundary signal $S_t$, the digital line-locked PLL 289 generates the interpolation phase $S_{ic}$ utilized by the digital interpolator 280 to re-scale the pre-luminance signal Y', the first pre-chrominance signal U' and the second pre-chrominance signal V'.

Figure 3:
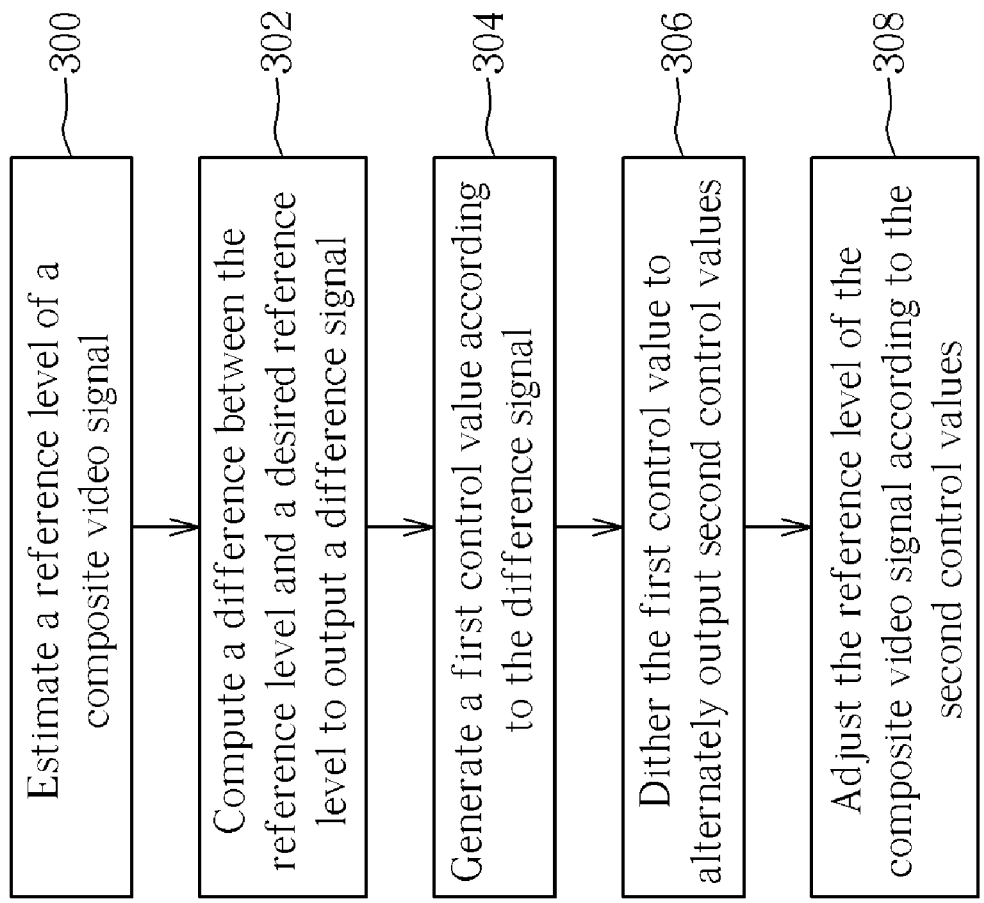
FIG. 3 is a flowchart illustrating a level clamping method according to an embodiment of the present invention.

FIG. 3 is a flowchart illustrating the level clamping method according to an embodiment of the present invention. The level clamping method is detailed as follows.

Step 300: Estimate a reference level of a composite video signal.

Step 302: Compute a difference between the reference level and a desired reference level to output a difference signal.

Step 304: Generate a first control value according to the difference signal.

Step 306: Dither the first control value to alternately output a plurality of second control values.

Step 308: Generate an analog signal to adjust the reference level of the composite video signal through utilizing the second control values to charge or discharge a capacitor through which the composite video signal passes.

In contrast to the prior art, the present invention provides an apparatus and related method for level clamping a composite video signal utilizing a dithering circuit. The dithering circuit solves the problem of precision mismatch between a DAC and a clamping computation circuit. Therefore, with the help of the novel level clamping control structure disclosed by the present invention, the capacitor is precisely charged or discharged for clamping the desired blank level though a low-resolution DAC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level clamping control circuit for clamping an input signal, comprising:
    a reference level estimator for estimating a reference level of the input signal;
    a subtractor, coupled to the reference level estimator, for computing a difference between the reference level and a desired reference level to output a difference signal;
    a clamping computation circuit, coupled to the subtractor, for generating a first control value according to the difference signal;
    a dithering circuit, coupled to the clamping computation circuit, for dithering the first control value to alternately output a plurality of second control values; and
    a digital-to-analog converter (DAC), coupled to the dithering circuit and a capacitor, for generating an analog signal to alternatively charge and discharge the capacitor to adjust the reference level of the input signal according to the second control values.

2. The level clamping control circuit of claim 1, wherein the DAC is a current-output DAC.

3. The level clamping control circuit of claim 1, wherein before the reference level estimator estimates a new reference level of the input signal, the dithering circuit always keeps dithering the first control value, and the DAC always keeps charging or discharging the capacitor.

4. The level clamping control circuit of claim 1, wherein the number of the second control values dithered from the first control value is two.

5. The level clamping control circuit of claim 1, wherein the second control values are integers.

6. The level clamping control circuit of claim 1, wherein the level clamping control circuit is implemented in a video decoder.

7. The level clamping control circuit of claim 1, wherein the input signal is a composite video signal.

8. The level clamping control circuit of claim 7, wherein the composite video signal complies with an NTSC (National Television System Committee) specification or a PAL (Phase Alternate Line) specification.

9. The level clamping control circuit of claim 7, wherein the reference level indicates a blank level of the composite video signal.

10. A method for level clamping an input signal, comprising:
    estimating a reference level of the input signal;
    computing a difference between the reference level and a desired reference level to output a difference signal;
    generating a first control value according to the difference signal;
    dithering the first control value to alternately output a plurality of second control values; and
    generating an analog signal to adjust the reference level of the input signal according to the second control values.

11. The method of claim 10, wherein the number of the second control values dithered from the first control value is two.

12. The method of claim 10, wherein the second control values are integers.

13. The method of claim 10, wherein before estimating a new reference level of the input signal, the step of dithering the first control value always keeps dithering the first control value.

14. The method of claim 13, wherein before estimating the new reference level of the input signal, the step of generating the analog signal always keeps charging or discharging a capacitor to adjust the reference level of the input signal.

15. The method of claim 10, wherein the input signal is a composite video signal.

16. The method of claim 15, wherein the composite video signal complies with an NTSC (National Television System Committee) specification or a PAL (Phase Alternate Line) specification.

17. The method of claim 15, wherein the reference level indicates a blank level of the composite video signal.

* * * * *